US009076830B2

(12) United States Patent
Kremerman et al.

(10) Patent No.: US 9,076,830 B2
(45) Date of Patent: Jul. 7, 2015

(54) ROBOT SYSTEMS AND APPARATUS ADAPTED TO TRANSPORT DUAL SUBSTRATES IN ELECTRONIC DEVICE MANUFACTURING WITH WRIST DRIVE MOTORS MOUNTED TO UPPER ARM

(71) Applicant: Applied Materials, Inc., Santa Clara, CA (US)

(72) Inventors: Izya Kremerman, Los Gatos, CA (US); Jeffrey C. Hudgens, San Francisco, CA (US); Damon Keith Cox, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 278 days.

(21) Appl. No.: 13/662,946

(22) Filed: Oct. 29, 2012

(65) Prior Publication Data
US 2013/0115028 A1 May 9, 2013

Related U.S. Application Data

(60) Provisional application No. 61/555,166, filed on Nov. 3, 2011.

(51) Int. Cl.
*H01L 21/677* (2006.01)
*B25J 9/04* (2006.01)

(52) U.S. Cl.
CPC .......... *H01L 21/67742* (2013.01); *B25J 9/044* (2013.01); *B25J 9/043* (2013.01); *H01L 21/67754* (2013.01)

(58) Field of Classification Search
CPC ..... B25J 9/043; B25J 9/044; H01L 21/67754; H01L 21/67742

USPC .............. 414/744.3, 744.5; 901/19
See application file for complete search history.

(56) References Cited

U.S. PATENT DOCUMENTS

| | | | |
|---|---|---|---|
| 5,765,983 A | 6/1998 | Caveney et al. |
| 5,811,951 A | 9/1998 | Young |
| 5,993,142 A | 11/1999 | Genov et al. |
| 6,002,840 A | 12/1999 | Hofmeister |
| 6,037,733 A | 3/2000 | Genov et al. |
| 6,121,743 A | 9/2000 | Genov et al. |
| 6,195,619 B1 | 2/2001 | Ren |
| 6,428,266 B1 | 8/2002 | Solomon et al. |
| 6,485,250 B2 | 11/2002 | Hofmeister |
| 6,593,718 B1 | 7/2003 | Yamazoe |

(Continued)

FOREIGN PATENT DOCUMENTS

WO    WO 97-10079    3/1997
WO    WO-2010-080983    7/2010

OTHER PUBLICATIONS

Reply to Office Action of U.S. Appl. No. 12/684,672, filed Jan. 25, 2013.

(Continued)

*Primary Examiner* — Gerald McClain
(74) *Attorney, Agent, or Firm* — Dugan & Dugan, PC

(57) ABSTRACT

Substrate transport systems and robot apparatus are provided. The systems are adapted to pick or place a substrate at a destination by independently rotating an upper arm, a forearm, and dual wrist members relative to each other and a base. Methods of operating the robot apparatus are provided, as are numerous other aspects.

14 Claims, 7 Drawing Sheets

(56) References Cited

U.S. PATENT DOCUMENTS

| | | | |
|---|---|---|---|
| 6,643,563 | B2 | 11/2003 | Hosek et al. |
| 6,669,434 | B2 | 12/2003 | Namba et al. |
| 6,673,161 | B2 | 1/2004 | Ha et al. |
| 6,737,826 | B2 * | 5/2004 | Gilchrist .................. 414/744.8 |
| 6,893,204 | B1 * | 5/2005 | Suzuki et al. ............. 414/744.5 |
| 6,960,057 | B1 | 11/2005 | Hofmeister |
| 7,086,822 | B2 | 8/2006 | Maeda |
| 7,245,989 | B2 | 7/2007 | Hosek et al. |
| 7,891,935 | B2 | 2/2011 | Kremerman |
| 8,007,218 | B2 | 8/2011 | Park et al. |
| 8,777,547 | B2 * | 7/2014 | Kremerman et al. ...... 414/744.5 |
| 2002/0098072 | A1 | 7/2002 | Sundar |
| 2004/0131461 | A1 | 7/2004 | Momoki |
| 2005/0011294 | A1 | 1/2005 | Hashimoto et al. |
| 2005/0095111 | A1 | 5/2005 | Kim et al. |
| 2006/0177296 | A1 | 8/2006 | Wirth |
| 2006/0245905 | A1 | 11/2006 | Hudgens |
| 2007/0020081 | A1 * | 1/2007 | Gilchrist et al. ........... 414/744.5 |
| 2007/0116549 | A1 | 5/2007 | Rice et al. |
| 2007/0166135 | A1 | 7/2007 | Koike |
| 2007/0209593 | A1 | 9/2007 | Aggarwal et al. |
| 2007/0217896 | A1 | 9/2007 | Kim et al. |
| 2008/0063504 | A1 | 3/2008 | Kroetz et al. |
| 2008/0175694 | A1 | 7/2008 | Park et al. |
| 2008/0232947 | A1 | 9/2008 | van der Meulen et al. |
| 2008/0298945 | A1 | 12/2008 | Cox et al. |
| 2010/0178135 | A1 | 7/2010 | Laceky et al. |
| 2010/0178146 | A1 | 7/2010 | Kremerman et al. |
| 2010/0178147 | A1 | 7/2010 | Kremerman et al. |
| 2013/0039726 | A1 * | 2/2013 | Brodine et al. ............ 414/744.5 |
| 2013/0149076 | A1 | 6/2013 | Cox et al. |
| 2014/0286736 | A1 | 9/2014 | Kremerman et al. |

OTHER PUBLICATIONS

Final Office Action of U.S. Appl. No. 12/684,672, mailed Feb. 7, 2013.
Notice of Allowance of U.S. Appl. No. 12/684,672 mailed Mar. 24, 2014.
Feb. 28, 2014 Reply to Nov. 29, 2013 Office Action of U.S. Appl. No. 12/684,672.
International Preliminary Report on Patentability of International Application No. PCT/US12/063110 mailed May 15, 2014.
Preliminary Amendment of U.S. Appl. No. 14/301,382, filed Jun. 11, 2014.
International Preliminary Report on Patentability of International Application No. PCT/US12/068711 mailed Jun. 26, 2014.
Jul. 19, 2013 Reply to May 2, 2013 Office Action of U.S. Appl. No. 12/684,672.
Final Office Action of U.S. Appl. No. 12/684,672 mailed Jul. 31, 2013.
Office Action of U.S. Appl. No. 13/709,485 mailed Sep. 25, 2014.
Office Action of U.S. Appl. No. 12/684,672 mailed Nov. 29, 2013.
Office Action of U.S. Appl. No. 12/684,672 mailed May 2, 2013.
Oct. 31, 2013 Reply to Jul. 31, 2013 Final Office Action of U.S. Appl. No. 12/684,672.
Advisory Action of U.S. Appl. No. 12/684,672 mailed Nov. 6, 2013.
Moriyama et al., "Magnetically Suspended Linear Pulse Motor for Semiconductor Wafer Transfer in Vacuum Chamber", Jul. 1996, NASA Technical Reports Server, pp. 275-288.
Office Action of U.S. Appl. No. 12/684,672 mailed Oct. 25, 2012.
International Search Report and Written Opinion of International Application No. PCT/US12/068711 mailed Mar. 18, 2013.
International Search Report and Written Opinion of International Application No. PCT/US12/063110 mailed Mar. 19, 2013.
Apr. 8, 2013 Reply to Feb. 7, 2013 Final Office Action of U.S. Appl. No. 12/684,672.
Advisory Action of U.S. Appl. No. 12/684,672 mailed Apr. 15, 2013.
Final Office Action of U.S. Appl. No. 13/709,485 mailed Jan. 9, 2015.
Dec. 26, 2014 Reply to Sep. 25, 2014 Non-Final Office Action of U.S. Appl. No. 13/709,485.
Feb. 25, 2015 Reply to Jan. 9, 2015 Final Office Action of U.S. Appl. No. 13/709,485.
Advisory Action of U.S. Appl. No. 13/709,485 mailed Mar. 10, 2015.
Non-Final Office Action of U.S. Appl. No. 13/709,485 mailed Apr. 20, 2015.
RCE & Supplemental Amendment of U.S. Appl. No. 13/709,485 filed Apr. 9, 2015.

* cited by examiner

US 9,076,830 B2

ROBOT SYSTEMS AND APPARATUS ADAPTED TO TRANSPORT DUAL SUBSTRATES IN ELECTRONIC DEVICE MANUFACTURING WITH WRIST DRIVE MOTORS MOUNTED TO UPPER ARM

RELATED APPLICATIONS

The present invention is related to and claims priority to U.S. Provisional Patent Application No. 61/555,166, filed on Nov. 03, 2011, entitled "ROBOT SYSTEMS, APPARATUS, AND METHODS ADAPTED TO TRANSPORT DUAL SUBSTRATES IN ELECTRONIC DEVICE MANUFACTURING," the entirety of which is incorporated herein by reference. The present application is also related to U.S. patent application Ser. No. 12/684,672, filed Jan. 8, 2010, entitled "SYSTEMS, APPARATUS AND METHODS FOR TRANSPORTING SUBSTRATES" and U.S. patent application Ser. No. 14/301,382, filed Jun. 11, 2014, entitled "SYSTEMS, APPARATUS AND METHODS FOR TRANSPORTING SUBSTRATES IN ELECTRONIC DEVICE MANUFACTURING" and U.S. patent application Ser. No. 13/709,485, filed Dec. 10, 2012, entitled "FULLY-INDEPENDENT ROBOT SYSTEMS, APPARATUS, AND METHODS ADAPTED TO TRANSPORT MULTIPLE SUBSTRATES IN ELECTRONIC DEVICE MANUFACTURING".

FIELD

The present invention relates to electronic device manufacturing, and more specifically to systems, apparatus, and methods adapted to transport dual substrates.

BACKGROUND

Conventional electronic device manufacturing systems may include multiple chambers, such as process chambers and one or more load lock chambers. Such chambers may be included in cluster tools where a plurality of chambers may be distributed about a central transfer chamber, for example. These systems may employ transfer robots that may be housed within the transfer chamber and are adapted to transport substrates between the various chambers. Efficient and precise transport of substrates between the system chambers may be desirable for system throughput, thereby lowering overall operating and production costs. Furthermore, reduced system size is sought after because distances that the substrates need to move may be reduced. Moreover, material costs may be reduced by reducing system size.

Accordingly, improved systems, apparatus, and methods for efficient and precise movement of dual substrates are desired.

SUMMARY

In a first aspect a robot apparatus adapted to transport substrates within an electronic device processing system is provided. The robot apparatus includes a base, an upper arm adapted to rotate relative to the base about a first rotational axis, a forearm coupled to the upper arm at a first position offset from the first rotational axis, the forearm adapted to rotate about a second rotational axis at the first position, dual wrist members coupled to and adapted for rotation relative to the forearm about a third rotational axis at a second position offset from the second rotational axis, the dual wrist members each adapted to couple to respective end effectors, wherein each respective end effector is adapted to carry a substrate, an upper arm drive assembly adapted to rotate the upper arm relative to the base, a forearm drive assembly adapted to rotate the forearm relative to the upper arm, the forearm drive assembly including a forearm drive motor mounted to the upper arm, and a wrist drive assembly adapted to independently rotate the dual wrist members relative to the forearm, the wrist drive assembly including a first wrist drive motor and second wrist drive motor mounted to the upper arm.

According to another aspect an electronic device processing system is provided. The system includes a chamber; a robot apparatus at least partially contained in a transfer chamber and adapted to transport a substrate to a process chamber or load lock chamber, the robot apparatus including a base; an upper arm adapted to rotate relative to the base about a first rotational axis; a forearm coupled to the upper arm at a first position offset from the first rotational axis, the forearm adapted to rotate about a second rotational axis at the first position; dual wrist members coupled to and adapted for rotation relative to the forearm about a third rotational axis at a second position offset from the second rotational axis, the dual wrist members each adapted to couple to respective end effectors, wherein each respective end effector is adapted to carry a substrate; an upper arm drive assembly adapted to rotate the upper arm relative to the base; a forearm drive assembly adapted to rotate the forearm relative to the upper arm, the forearm drive assembly including a forearm drive motor mounted to the upper arm; and a wrist member drive assembly adapted to independently rotate the dual wrist members relative to the forearm, the wrist member drive assembly including a first wrist drive motor and a second wrist drive motor mounted to the upper arm.

In another aspect, a method of transporting a substrate within an electronic device processing system is provided. The method includes providing a robot apparatus having a base, an upper arm, a forearm, and dual wrist members; independently rotating the upper arm relative to the base; independently rotating the forearm relative to the upper arm; and independently rotating the dual wrist members relative to the forearm.

Numerous other features are provided in accordance with these and other aspects of the invention. Other features and aspects of the present invention will become more fully apparent from the following detailed description, the appended claims and the accompanying drawings.

DETAILED DESCRIPTION

Figure 1A:
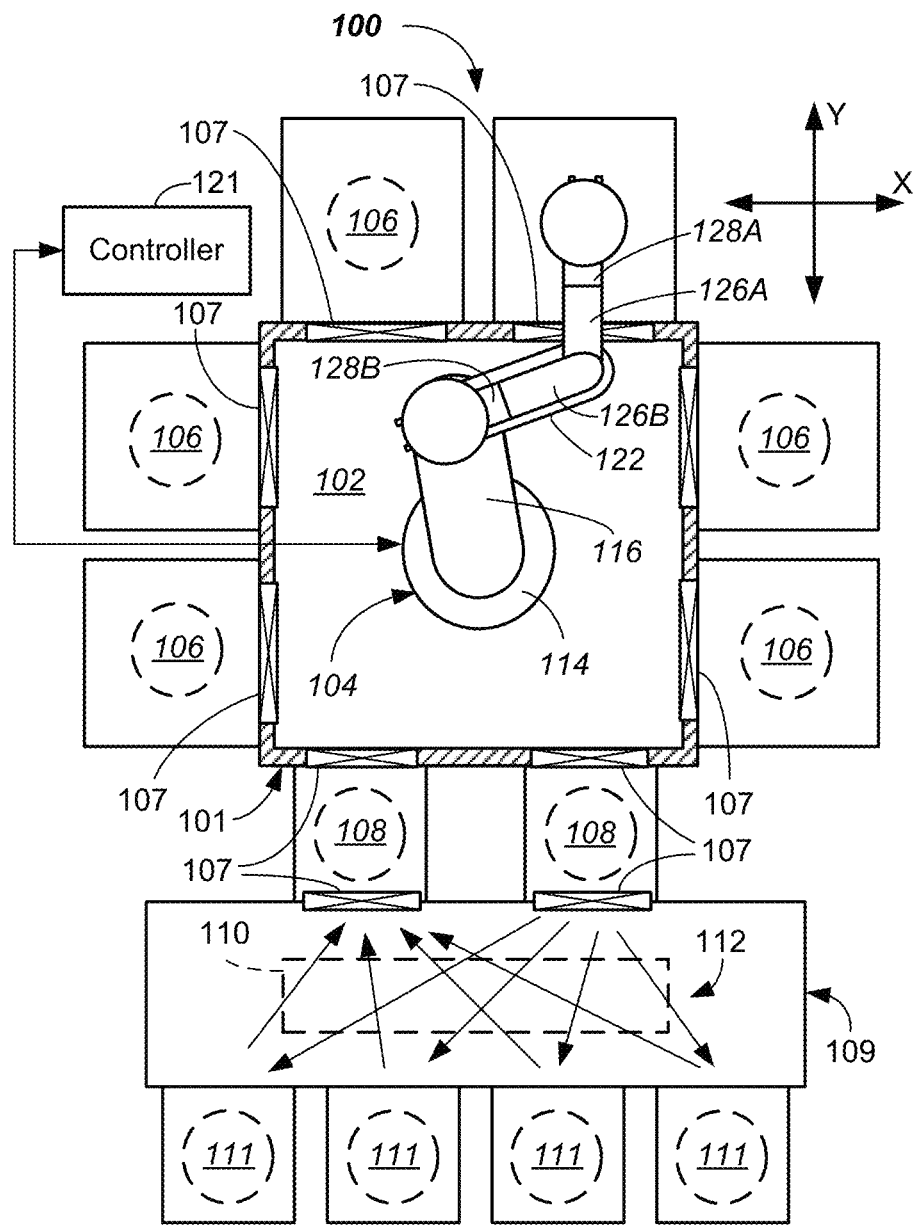
FIG. 1A illustrates a schematic top view of a substrate processing system including a robot apparatus located in a transfer chamber according to embodiments.

Electronic device manufacturing may desire very precise and rapid transport of substrates between various locations. In particular, dual end effectors, sometimes referred to as "dual blades," may be attached at an end of an arm of a robot apparatus and may be adapted to transport substrates resting upon the end effectors to and from process chambers and/or one or more load locks of a substrate processing system. When the arms are long, rigidity of the robot mechanism may be a concern in that rapid starts and stops of the robot apparatus may cause vibration of the end effector, which takes time to settle. Furthermore, conventional selective compliance assembly robot arm (SCARA) robots may only enter and exit transfer chambers in a straight-on fashion, thereby limiting their versatility. In other words, SCARA robots may only translate their end effector along a radial line passing through their shoulder axis.

In some systems, especially mainframes having a large number of perpendicular and parallel facets (e.g., 5 or more, or even 6 facets) and multiple load-locks, such as shown in FIG. 1, the transfer chamber is desired to be made as small as possible, in order to reduce system cost and size. Such size reductions may also minimize the distance that substrates need to move between process chambers and load locks. However, packaging the robot apparatus in a small space envelope represents a significant challenge for existing robots, while still being able to carry out substrate exchange at the various chambers. In particular, exchange into such mainframes having multiple parallel facets, i.e., with twin chambers oriented in a side-by-side configuration is challenging with conventional SCARA robots.

In order to reduce the size of the robot and enable servicing of cluster tools having multiple parallel-faceted chambers, embodiments of the present invention, in a first aspect, provide a robot apparatus having a compact configuration and minimal number of components, but with each component being individually controllable. Robot apparatus embodiments including an upper arm, a forearm attached directly to the upper arm, and multiple wrist elements rotatable on the forearm upper arm and having attached dual blades are described. Each of the upper arm, forearm, and multiple wrist elements are independently controllable and moveable. This highly functional configuration enables the overall size envelope of the robot to be reduced, and allows entry into chambers and load locks in a non straight-on orientation, i.e., non-normal to the chamber facet or straight on, such as when multiple, parallel-faceted process chambers or load lock chambers are serviced. Moreover, the substrate transfer and exchange motions may be carried out with a minimum number of robotic arms.

In another aspect, an electronic device processing system is provided that includes a multi-blade robot apparatus that may be used for transporting substrates between chambers in electronic device manufacturing. The electronic device processing system includes a transfer chamber and a robot apparatus received in the chamber. The robot apparatus includes, as mentioned above, a base, an upper arm rotatable relative to the base, a forearm rotatable on the upper arm, and multiple wrist members rotatable on the forearm. Independent rotational capability of each of the upper arm, forearm, and the multiple wrist members provides extreme flexibility of substrate orientation and motion.

Further details of example embodiments of various aspects of the invention are described with reference to FIGS. 1A-3 herein.

Figure 1B:
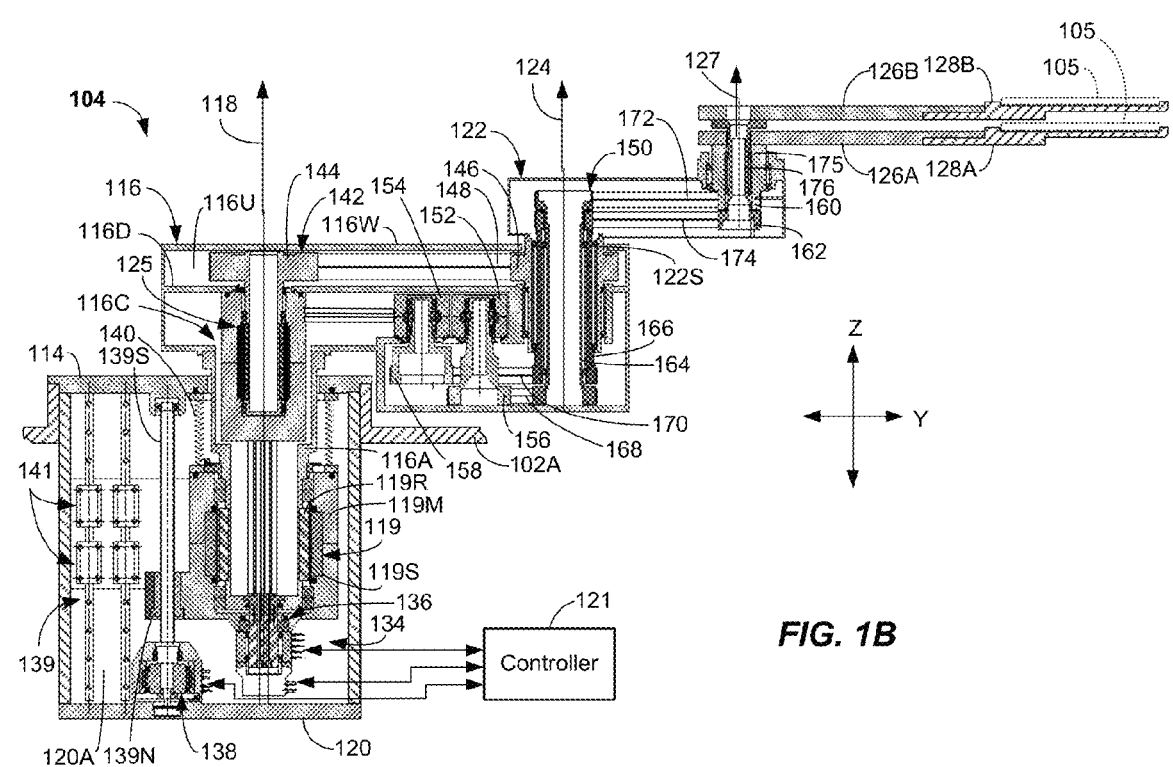
FIG. 1B illustrates a side cross-sectional view of a robot apparatus including dual blades according to embodiments.
Figure 1C:
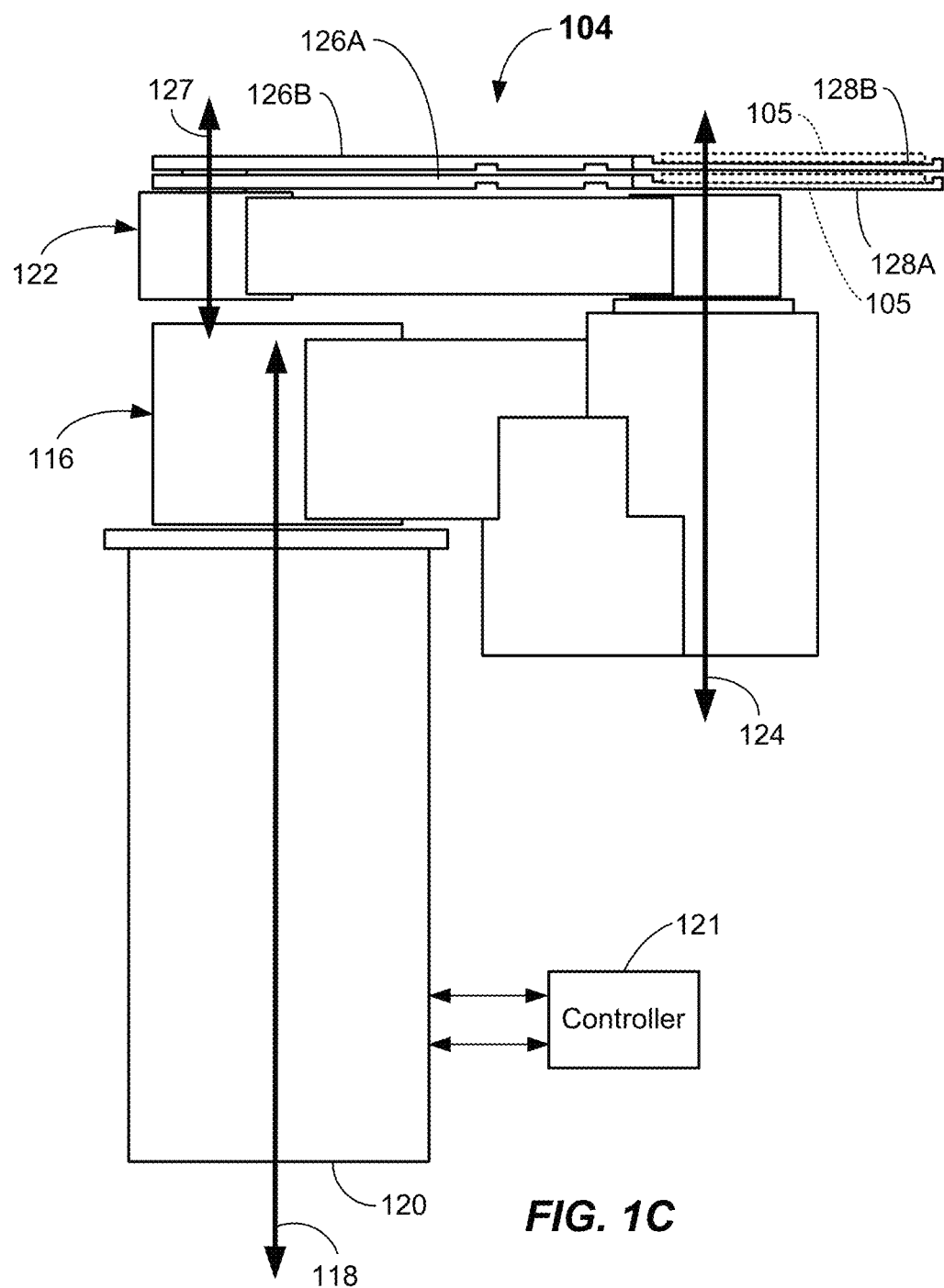
FIG. 1C illustrates a side view of an embodiment of the robot apparatus according to embodiments.

Referring now to FIGS. 1A-1C, an exemplary embodiment of an electronic device processing system 100 according to the present invention is disclosed. The electronic device processing system 100 is useful to, and may be adapted to, transfer substrates between various process chambers, and/or exchange substrates at a chamber, for example. The electronic device processing system 100 includes a housing 101 including a transfer chamber 102. The transfer chamber 102 includes top, bottom and side walls and may be maintained in a vacuum, for example. A robot apparatus 104 is received in the transfer chamber 102 and is adapted to be operable therein. The robot apparatus 104 may be adapted to pick or place a substrate 105 (sometimes referred to as a "wafer" or "semiconductor wafer") to or from a destination. The destination may be a chamber coupled to the transfer chamber 102. For example, the destination may be one or more process chambers 106 and/or one or more load lock chambers 108 that may be coupled to the transfer chamber 102.

Process chambers 106 may be adapted to carry out any number of process steps on the substrates 105, such as deposition, oxidation, nitration, etching, polishing, cleaning, lithography, metrology, or the like. The load lock chambers 108 may be adapted to interface with a factory interface 109 or other system component, that may receive substrates 105 from substrate carriers 111 (e.g., Front Opening Unified Pods (FOUPs)) docked at load ports of the factory interface 109. Another robot 110 (shown dotted) may be used to transfer substrates 105 between the substrate carriers 111 and the load locks 108 as shown by arrows 112. Transfers may be carried out in any order or direction. One or more conventional slit valves 107 may be provided at the entrance to each process chamber 106 and load lock chamber 108.

Again referring to FIGS. 1A-1C, the robot apparatus 104 includes a base 114 adapted to be attached to a wall (e.g., a floor) of the housing 101 forming a part of the transfer chamber 102, and an upper arm 116, which, in the depicted embodiment, is a substantially rigid cantilever beam. The upper arm 116 is adapted to be independently rotated about a first rotational axis 118 in either a clockwise or counterclockwise rotational direction. The rotation about first rotational axis 118 may be provided by any suitable motive member, such as upper arm drive motor 119 that may be received in a motor housing 120, such as a conventional variable reluctance or permanent magnet electric motor. The rotation of the upper arm 116 may be controlled by suitable commands to the upper arm drive motor 119 from a controller 121. In some embodiments, the motor housing and base may be made integral with one another. In other embodiments, the base 114 may be made integral with the floor of the transfer chamber 102.

Mounted and rotationally coupled at an outboard end of the upper arm 116, at a radial position spaced from the first rotational axis 118, is a forearm 122. The forearm 122 may be adapted to be rotated in an X-Y plane relative to the upper arm 116 about a second rotational axis 124 at the radial position. The forearm 122 is independently rotatable in the X-Y plane relative to the base 114 and the upper arm 116 by a forearm drive motor 125 as will be described further herein.

Located on an outboard end of the forearm 122 at a position spaced from the second rotational axis 124 are multiple wrist members 126A, 126B. The wrist members 126A, 126B are each adapted for independent rotation in the X-Y plane relative to the forearm 122 about a third rotational axis 127. Furthermore, the wrist members 126A, 126B are each adapted to couple to end effectors 128A, 128B (otherwise referred to as a "blades"), wherein the end effectors 128A, 128B are each adapted to carry and transport a substrate 105 during pick and/or place operations. The end effectors 128A, 128B may be of any suitable construction. The end effectors 128A, 128B may be passive or may include some active means for holding the substrate 105 such as a mechanical clamp or electrostatic capability. The end effectors 128A, 128B may be coupled to the wrist members 126A, 126B by any suitable means such as mechanical fastening, adhering, clamping, etc. Optionally, the respective wrist members 126A, 126B and end effectors 128A, 128B may be coupled to each other by being formed as one integral piece. Rotation of each wrist member 126A, 126B is imparted by wrist drive motors as will be described herein below.

Again referring to FIGS. 1A-1C, the embodiment of robot apparatus 104 that is shown in FIG. 1B-1C may be adapted to be used in the substrate processing system 100 of FIG. 1. In operation, once the upper arm 116 is positioned adjacent to the desired destination for a pick or place of a substrate 105, the forearm 122 may be suitably actuated, along with the multiple wrist members 126A, 126B to pick, place, or pick and place (e.g., exchange) a substrate 105 to or from the destination (e.g., a process chamber 106 or load lock chamber 108). The wrist members 126A, 126B are each independently rotatable in the X-Y plane relative to the base 114, the upper arm 116, the forearm 122, and each other, as will be described further herein. Accordingly, the end effectors may be inserted into each process chamber 106 in a straight in manner, i.e., inserted in a direction substantially perpendicular to the facet of the process chamber. This is referred to herein as off-axis capability.

In the depicted embodiment of FIG. 1A, the robot apparatus 104 is shown located and housed in a transfer chamber 102. However, it should be recognized that this embodiment of robot apparatus 104, as well as the other robot apparatus described herein, may advantageously be used in other areas of electronic device manufacturing, such as in a factory interface 109 wherein the robot apparatus 104 may transport substrates 105 or substrate carriers 111 between load ports and one or more load lock chambers 108 of the processing system, for example. The robot apparatus 104 described herein (e.g., apparatus 100) is also capable of other transporting uses.

Figure 2A:
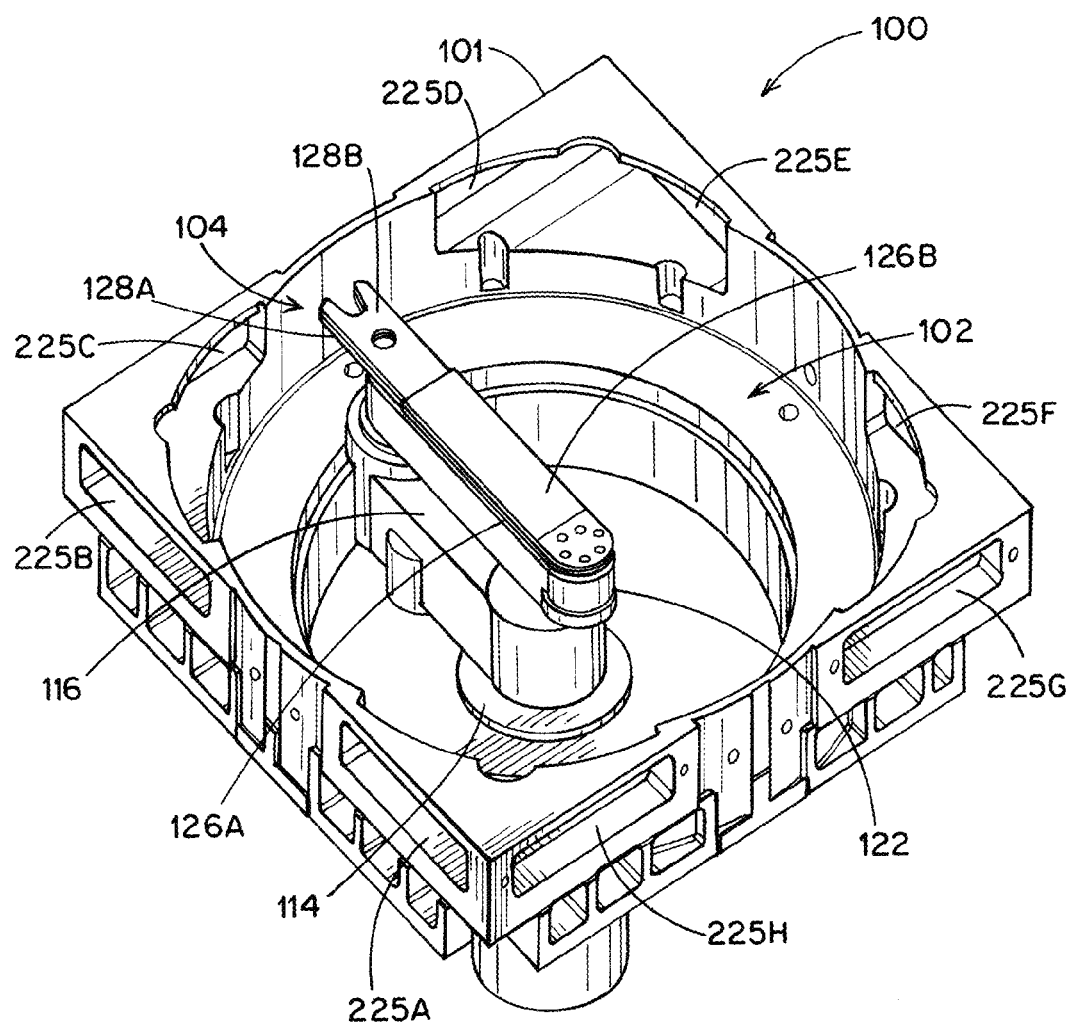
FIG. 2A illustrates an isometric view of an embodiment of a robot apparatus shown in a transfer chamber in a folded home position.
Figure 2B:
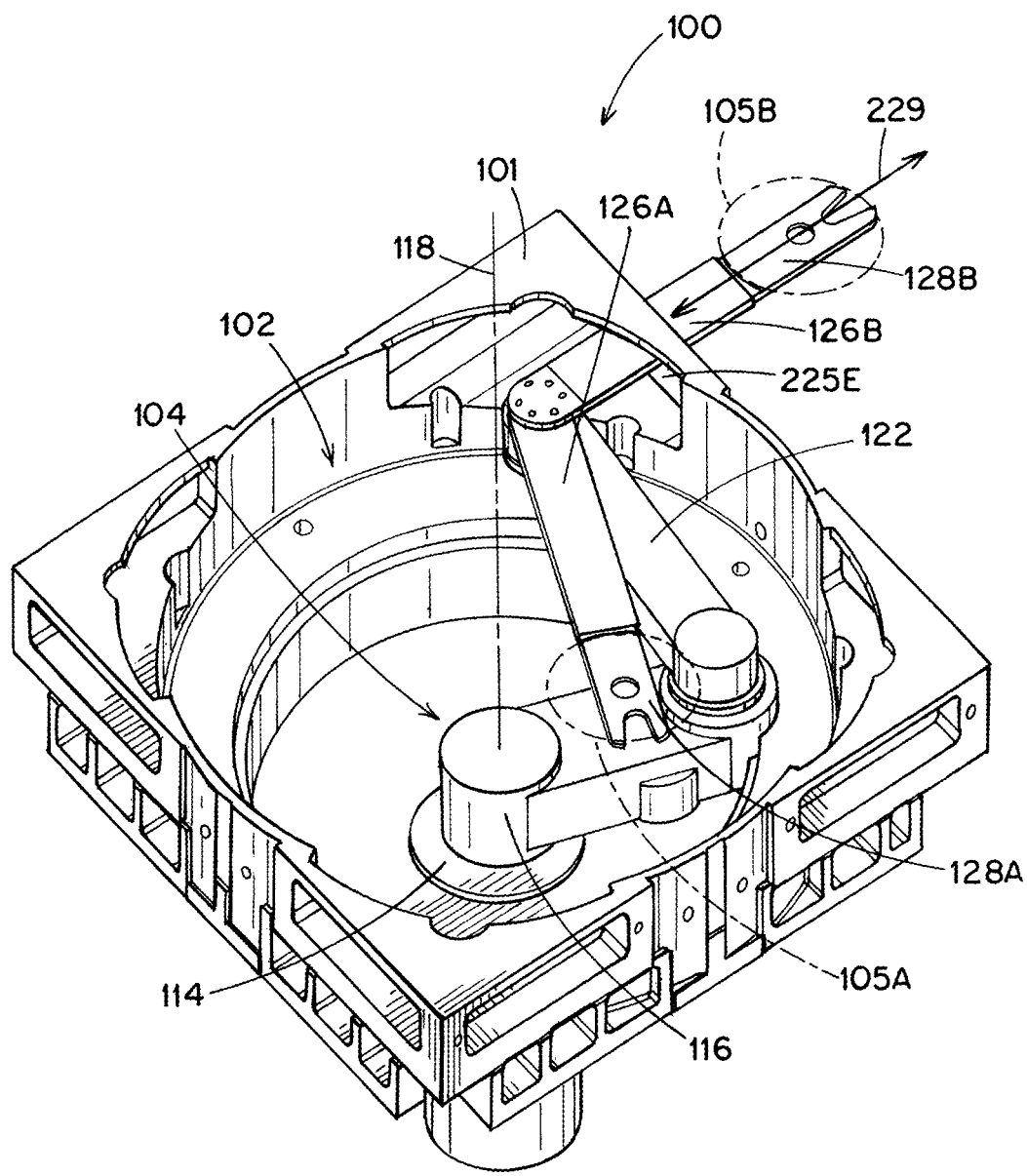
FIG. 2B illustrates an isometric view of an embodiment of a robot apparatus shown in an extended position.
Figure 2C:
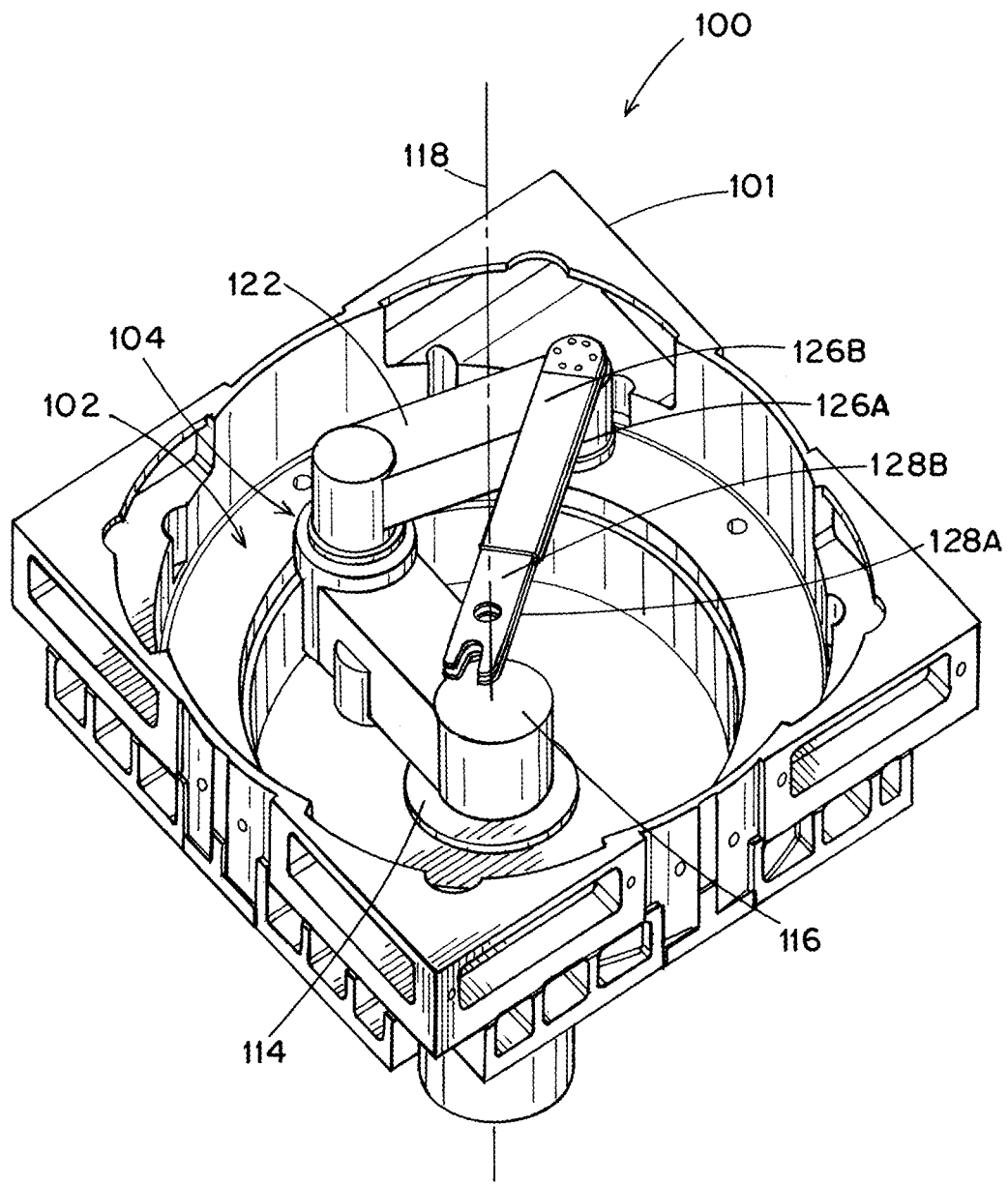
FIG. 2C illustrates an isometric view of an embodiment of a robot apparatus shown in a retracted position.

FIGS. 2A-2C illustrate various positional capabilities of embodiments of the robotic apparatus 104. In each, as will be apparent following the descriptions below, the upper arm 116 may be independently rotated relative to the base 114. Similarly, the forearm 122 may be independently rotated relative to the upper arm 116. Likewise, the wrist members 126A, 126B (and coupled end effectors 128A, 128B) may be independently rotated relative to the forearm 122, and also relative to each other. For example, FIG. 2A illustrates the robot apparatus 104 provided in the housing 101 with the upper arm 116, forearm 122, and wrist members 126A, 126B all rotated such that they lie one atop another in vertical alignment. This allows the robot 104 to be quickly rotated to service any of the openings 225A-225H to the chambers 106 (chambers not shown in FIGS. 2A-2C). Eight openings 225A-225H to the chambers 106 are shown. However, it should be understood that the robot apparatus 104 may service more or less numbers of openings and chambers.

FIG. 2B illustrates a electronic device processing system 100 including the robot apparatus 104 with the wrist element 126B and end effector 128B inserted through a chamber opening 225E in the same way as would be practiced to pick a substrate 105B from a process chamber 106 (not shown) attached to the opening 225E. The upper arm 116, forearm 122, and wrist element 126B may be rotated independently as the end effector 128B is inserted through the opening 225E. At the same time, the wrist element 126A and end effector 128A containing another substrate 105A is readied to make exchange/transfer through the opening 225E when the substrate 105B is removed therefrom. Because the two wrist members 126A, 126B are independently rotatable relative to one another, the substrate 105A can always be placed at a convenient, non-interfering position within the transfer chamber 102 as the substrate 105B is being withdrawn. Similarly, once withdrawn, the substrate 105B can always be placed at a convenient, non-interfering position within the transfer chamber 102 as the substrate 105A is being placed in the process chamber (not shown in FIG. 2B). As shown, the robot apparatus 104 may be used to pick (e.g., remove) or place substrates 105A, 105B into process chambers in a direction that is off-axis. In off-axis motion, the translation of the end effector (e.g., end effector 126B) is into the chamber (e.g., chamber 106) in a direction that is substantially perpendicular to the facet of the chamber 106. Facet as used herein means the face onto which the process chamber 106 is attached. Off-axis motion refers to motion that is along a line 229 that is offset radially from the first rotational axis 118. By utilizing a robot apparatus 104 exhibiting off-axis motion capability, the six process chambers 106 and two load lock chambers 108 shown may be easily serviced while providing a small space envelope for the transfer chamber 102.

FIG. 2C illustrates another possible orientation that may be utilized when quickly moving the robot apparatus 104 to service another opening in the mainframe. In the depicted embodiment, the substrates (not shown in FIG. 2C) mounted on the end effectors 128A, 128B may each be oriented approximately over the first rotational axis 118. In this orientation, made possible by the small number of arms, and the independent rotation capability of the upper arm 116, forearm 122, and wrist members 126A, 126B, rapid rotation about the first rotational axis 118 may be accomplished with minimal centrifugal forces being imparted to the substrates (not shown in FIG. 2C) resting on the end effectors 128A, 128B. Accordingly, the first wrist member 126A and second wrist member 126B, and thus the end effectors 128A, 128B, may be aligned at certain times through independent rotation. Conversely, at other times, the first wrist member 126A and second wrist member 126B, and thus the end effectors 128A, 128B, may be misaligned at other times through independent rotation capability thereof.

FIG. 1B illustrates a cross-sectioned side view of the robot apparatus 104 shown in a fully extended condition for ease of illustration. The robot apparatus 104 in this embodiment may include a base 114 that may include a flange or other attachment features adapted to attach to a wall (e.g., floor 102A) of the chamber (e.g., a transfer chamber 102), for example. The base 114 may be coupled to, or integral with, a motor housing 120 that contains the upper arm drive motor 119. The upper arm drive motor 119 is adapted to rotate the upper arm 116 in the X-Y plane about the first rotational axis 118 (e.g., +/−360 degrees or more). The upper arm 116 may be a rigid cantilever beam that may extend outwardly from the first rotational axis 118 in a radial direction.

The upper arm drive motor 119 may include a rotor 119R (e.g., one or more magnets) attached to a shaft 116A of the upper arm 116 and a stator 119S (e.g., a plurality of wire windings) mounted to an upper arm drive motor housing 119M. Control signals to the upper arm drive motor 119 from the controller 121 cause rotation of the upper arm 116 about the first rotational axis 118. In the depicted embodiment, signals to the various drive motors 119, 125, 152, and 154 from the controller 121 pass through a conventional slip ring assembly 134 and coupled wiring. Similarly, feedback signals from feedback sensors for each motor (e.g., optical or electrical sensors) may also pass through wiring and the slip ring assembly 134 to the controller 121. Accordingly, precise independent rotational control for each of the upper arm 116, forearm 122, and wrist members 126A, 126B may be imparted. Furthermore, a hermetic seal 136 (e.g., a ferrofluid seal) may be provided to maintain the chamber 102 and motors 125, 152 and 154 at a vacuum while the housing inside 120A of the motor housing 120 may be maintained at atmosphere. The shaft 116A and the respective upper arm 116 may be supported by multiple rotation accommodating bearings arranged between the shaft 116A and the upper arm drive motor housing 119M.

The robot apparatus 104 may further include a vertical motor 138 and a vertical drive mechanism 139 that is adapted to cause vertical motion (along the Z axis) of the upper arm 116, forearm 122, and connected end effectors 128A, 128B. The vertical drive mechanism 139 may include a worm drive, lead screw, ball screw, or rack and pinion mechanism that when rotated by the vertical motor 138 causes the upper arm drive motor housing 119M to translate vertically along the first rotational axis 118. A bellows 140 or other suitable vacuum barrier may be used to accommodate the vertical motion and also act as a vacuum barrier between the chamber 102 and the inside 120A of the motor housing 120 that may be at atmospheric pressure. One or more translation-accommodating devices 141, such as linear bearings, bushings, or other linear motion restraining means may be used to restrain the motion of the upper arm drive motor housing 119M to vertical motion only along the first rotational axis 118. In the depicted embodiment, a lead screw 139S engages a lead nut 139M mounted to the upper arm drive motor housing 119M. Vertical motor 138 may include a rotational pot to provide vertical position feedback information to the controller 121.

In the depicted embodiment, the upper arm 116 may include a cavity 116C adapted to receive at least a portion of the forearm drive motor 125. As with the upper arm drive motor 119, the forearm drive motor 125 may include a motor housing, a rotor, and a stator. The forearm drive motor 125 may be mounted to a divider 116D of the upper arm 116. Optionally, the forearm drive motor 125 may be mounted to the inside of shaft 116A.

Coupled to the rotor of the forearm drive motor 125 is a forearm drive assembly 142. The forearm drive assembly 142 may include drive member 144, a driven member 146, and a transmission element 148. The forearm drive assembly 142 may comprise any suitable structure for driving a pilot shaft 122S of the forearm 122. The pilot shaft 122S of the forearm 122 may be rotationally mounted to the divider 116D by one or more bearings (e.g., ball bearings) coupled between the pilot shaft 122S and the divider 116D. For example, in the depicted embodiment, the drive member 142 may be a pulley coupled to or integral with an inner shaft of the forearm drive motor 125, the driven member 146 may be a pulley coupled to or formed integrally with the pilot shaft 122S, and the transmission element 148 is connected between the drive member 144 and driven member 146. The transmission element 148 may be one or more belts or straps, such as two conventional metal straps wherein each strap is rigidly coupled (e.g., pinned) to the pulleys at its end and wherein the transmission element 148 extends in an upper chamber 116U of the upper arm 116 formed by the divider 116D and an upper arm upper wall 116W. In the depicted embodiment, the forearm drive motor 125 may be exposed to a vacuum.

The robot apparatus 104 also includes a wrist drive assembly 150. The wrist drive assembly 150 may be adapted to allow the wrist members 126A, 126B to be independently rotated about the third rotational axis 127 relative to the forearm 122. The wrist drive assembly 150 may include first and second wrist drive motors 152, 154 each being mounted to the upper arm 116 (e.g., mounted to divider 116D) and adapted to drive and cause independent rotation of the wrist members 126A, 126B. The wrist member drive assembly 150 may include first wrist drive member 156 and second wrist drive member 158, attached to the inner rotor of each of the respective wrist member drive motors 152, 154. The wrist member drive assembly 150 may also include first wrist driven member 160 and second wrist driven member 162. The wrist drive assembly 150 may also include multiple transfer shafts such as first transfer shaft 164, and second transfer shaft 166. The transfer shafts 164, 166 may be co-axial with each other and each may be adapted to rotate about the second rotational axis 124. In the depicted embodiment, the first transfer shaft 164 is rotationally mounted by bearings inside of the second transfer shaft 166, and the second transfer shaft 166 is rotationally mounted by bearings in the pilot shaft 122S of forearm 122. Accordingly, in the depicted embodiment, each of the transfer shafts 164, 166 and pilot shaft 122S are supported through the divider 116D. The wrist drive assembly 150 may also include first and second transmission elements 168, 170, respectively, coupled between the drive members 156, 158 and transfer shafts 164, 166, and third and fourth transmission elements 172, 174 coupled between the driven members 160, 162 and transfer shafts 164, 166.

Transfer shaft 164 is coupled to the wrist drive member 156 at its lower end and the wrist driven member 160 at its upper end by transmission elements 168, 172, respectively. The transfer shafts 164, 166 may each include suitable pulleys at their upper and lower ends. The wrist transmission elements 168, 170, 172, 174 may be one or more belts or straps, such as two conventional metal straps wherein each strap is rigidly coupled (e.g., pinned) to the connected pulleys at its end. Motion of the driven members 160, 162 causes precise and independent rotation of each of the first and second wrist shafts 175, 176 of the wrist members 126A, 126B. Wrist shaft 175 is mounted for rotation by one or more suitable bearings mounted between the forearm 122 and the wrist shaft 175. Similarly, wrist shaft 176 is mounted for rotation by one or more suitable bearings mounted between the wrist shaft 175 and the wrist shaft 176.

In the depicted embodiment, the wrist drive motors 152, 154 are each housed in a cavity 116C and may be exposed to a vacuum. Each of the respective drive motors 125, 152, 154 may be variable reluctance or permanent magnet electric motors, for example. Other types of motors may be used. They may each include feedback sensors to provide precise feedback of positional information to the controller 121. Conductors to and from the motors 125, 152, 154 may pass through the cavity 116C and connect to the slip ring assembly 134. The wrist drive motors 152, 154 are each mounted to the upper arm 116, and particularly to a divider 116D thereof either directly or indirectly. The wrist drive motors 152, 154 may be arranged as show, being aligned along a link length of the upper arm 116, or arranged transversely to the upper arm in a side-by-side orientation where each is equa-distant from the second rotational axis 124 of the transfer shafts 164, 166.

In operation, control signals from the controller 121 to the wrist drive motor 152 causes rotation of the rotor relative to the stator thereof. This causes rotation of the first wrist drive member 156 and resultant rotation of the first transfer shaft 164 and first wrist driven member 160, thus causing independent rotation of the first wrist member 126A and the coupled first end effector 128A relative to the forearm 122. Likewise, control signals from the controller 121 to the second wrist drive motor 154 causes rotation of the rotor relative to the stator thereof. This causes rotation of the second wrist drive member 158 and resultant rotation of the second transfer shaft 166 and wrist driven member 162, thus causing independent rotation of the second wrist member 126B and the coupled second end effector 128B relative to the forearm 122. Similarly, control signals from the controller 121 to the forearm drive motor 125 causes rotation of the rotor relative to the stator thereof. This causes rotation of the forearm drive member 144 and resultant rotation of the forearm driven member 146, thus causing rotation of the forearm 122 relative to the upper arm 116. Thus, it should be apparent that rotation of the forearm 122 about the second rotational axis 124, and rotation of the wrist members 126A, 126B about the third rotational axis 127 in the X-Y plane may be independently accomplished relative to each other. Additionally, control signals from the controller 121 to the upper arm drive motor 119 cause rotation of the rotor 119R relative to the stator 119S thereof. This causes rotation of the shaft 116A and resultant rotation of the upper arm 116 relative to the base 114. Advantageously, an infinite number of transfer paths of the end effectors 128A, 128B may be accomplished by the robot apparatus 104. Thus, the transfer chamber 102 may be made smaller. Furthermore, pick and place from openings 225A-225H located in corners of the transfer chamber 102 may be accomplished.

Figure 3:
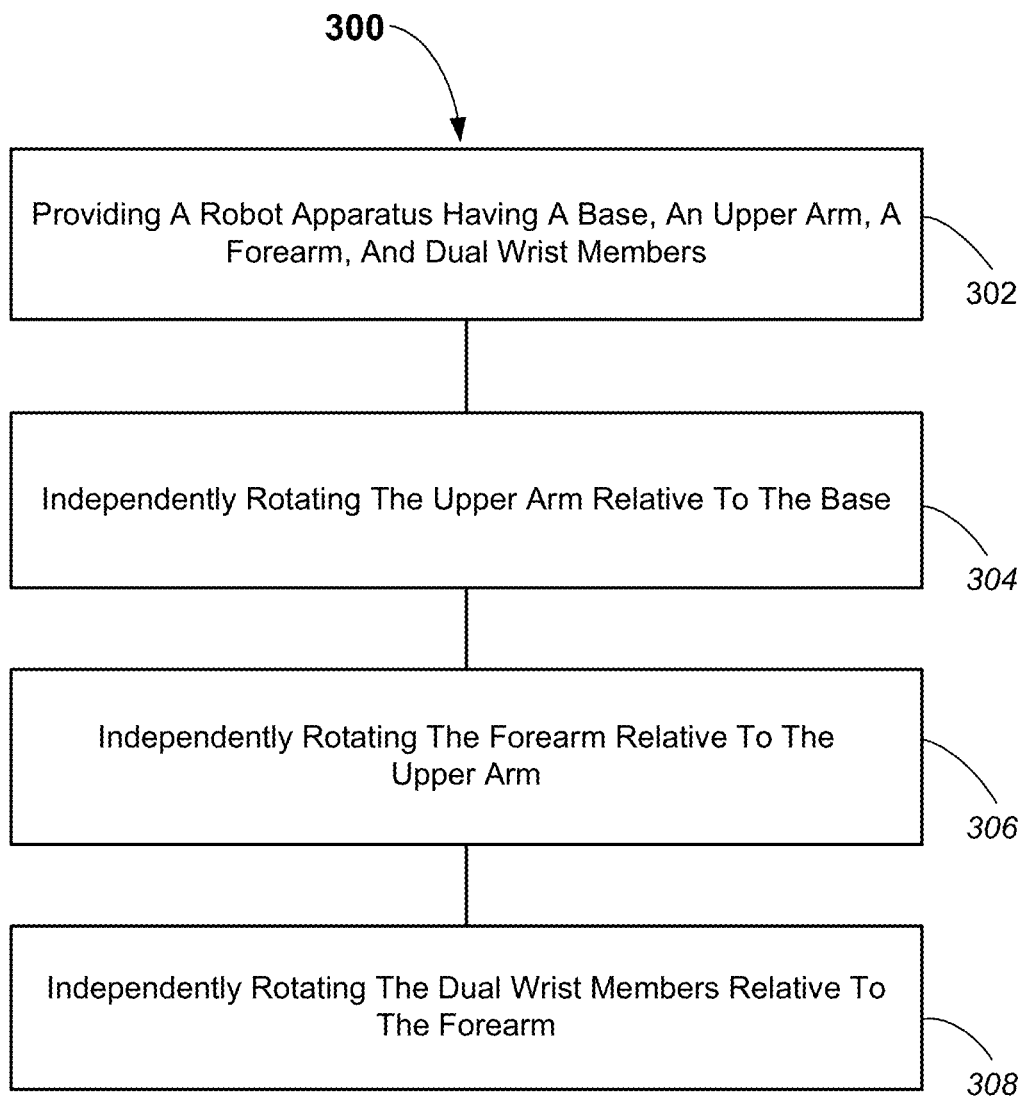
FIG. 3 illustrates a flowchart depicting a method of operating a robot apparatus according to embodiments.

A method 300 of transporting a substrate within an electronic device processing system according to the present invention is provided and described with reference to FIG. 3. The method 300 includes providing a robot apparatus having a base (e.g., base 114), an upper arm (e.g., upper arm 116), a forearm (e.g., forearm 122), and dual wrist members (e.g., wrist member 126A ad wrist member 126B) in 302, independently rotating the upper arm relative to the base in 304, independently rotating the forearm relative to the upper arm in 306, and independently rotating the dual wrist members relative to the forearm in 308.

As should be apparent, using the robot apparatus as described herein, a pick and place of a substrate may be accomplished from or to a destination location and the overall size of the robot apparatus, and thus the chamber housing the robot apparatus may be reduced. In some embodiments, the method is carried out by simultaneously rotating the upper arm (e.g., upper arm 116), the forearm (e.g., forearm 122), and at least one of the dual wrist members (e.g., wrist member 126B) to carry out a pick or place of a substrate from or to a chamber (e.g., a process chamber 106 or load lock chamber 108).

The foregoing description discloses only exemplary embodiments of the invention. Modifications of the above-disclosed systems, apparatus and methods which fall within the scope of the invention will be readily apparent to those of ordinary skill in the art. Accordingly, while the present invention has been disclosed in connection with exemplary embodiments thereof, it should be understood that other embodiments may fall within the scope of the invention, as defined by the following claims.

The invention claimed is:

1. A robot apparatus, comprising:
   a base;
   an upper arm adapted to rotate relative to the base about a first rotational axis, the upper arm including a divider;
   a forearm coupled to the upper arm at a first position offset from the first rotational axis, the forearm adapted to rotate about a second rotational axis at the first position;
   dual wrist members coupled to and adapted for rotation relative to the forearm about a third rotational axis at a second position offset from the second rotational axis, the dual wrist members each adapted to couple to respective end effectors, wherein each respective end effector is adapted to carry a substrate;
   an upper arm drive assembly adapted to rotate the upper arm relative to the base;
   a forearm drive assembly adapted to rotate the forearm relative to the upper arm, the forearm drive assembly including a forearm drive motor mounted to the upper arm, and a drive member above the divider; and
   a wrist drive assembly adapted to independently rotate the dual wrist members relative to the forearm, the wrist drive assembly including a first wrist drive motor and second wrist drive motor mounted to the upper arm, a first wrist drive member below the divider, and a second wrist drive member below the divider.

2. The robot apparatus of claim 1 wherein the upper arm drive assembly includes an upper arm drive motor located on an opposite side of the upper arm from the forearm and dual wrist members.

3. The robot apparatus of claim 2 wherein the upper arm drive assembly includes a rotor coupled to an upper arm drive shaft of the upper arm.

4. The robot apparatus of claim 2 wherein an upper arm motor housing of the upper arm drive motor is moveable along the first rotational axis by a vertical drive mechanism.

5. The robot apparatus of claim 4 wherein the vertical drive mechanism comprises a threaded drive shaft and a drive nut.

6. The robot apparatus of claim 1 wherein the forearm drive assembly including the forearm drive motor comprises a rotor attached to a forearm drive member and a stator coupled to a forearm drive member motor housing, wherein the forearm drive motor is at least partially contained in an upper arm drive shaft.

7. The robot apparatus of claim 1 wherein the forearm drive assembly includes a forearm drive member, a forearm driven member coupled to a forearm drive shaft, and a transmission element connected between the forearm drive member and the forearm driven member.

8. The robot apparatus of claim 1 wherein the wrist member drive assembly comprises a first transfer shaft and second transfer shaft passing through a forearm drive shaft.

9. The robot apparatus of claim 1 wherein the wrist member drive assembly comprises:
   a first wrist drive member, a first wrist driven member coupled to a first wrist drive shaft; and
   a second wrist drive member, a second wrist driven member coupled to a second wrist drive shaft.

10. The robot apparatus of claim 9, comprising:
    a first transfer shaft coupled to the first wrist drive member;
    a second transfer shaft passing through the first transfer shaft; and
    wherein the first transfer shaft is mounted for rotation in a forearm drive shaft.

11. The robot apparatus of claim 10, comprising:
    a first driving pulley on a first end of the first transfer shaft, and a first driven pulley on a second end of the first transfer shaft; and
    a second driving pulley on a first end of the second transfer shaft, and a second driven pulley on a second end of the second transfer shaft.

12. The apparatus of claim 11 comprising:
    a first drive element coupled between the first wrist driving member and the first driving pulley;
    a second drive element coupled between the second wrist driving member and the second driving pulley;
    a third drive element coupled between a first wrist driven member and the first driven pulley; and
    a fourth drive element coupled between a second wrist driven member and the second driven pulley.

13. The apparatus of claim 11 comprising the first transfer shaft and the second transfer shaft being supported by a divider of the upper arm.

14. An electronic device processing system, comprising:
a chamber;
a robot apparatus at least partially contained in a transfer chamber and adapted to transport a substrate to a process chamber or load lock chamber, the robot apparatus including
a base;
an upper arm adapted to rotate relative to the base about a first rotational axis, the upper arm including a divider;
a forearm coupled to the upper arm at a first position offset from the first rotational axis, the forearm adapted to rotate about a second rotational axis at the first position;
dual wrist members coupled to and adapted for rotation relative to the forearm about a third rotational axis at a second position offset from the second rotational axis, the dual wrist members each adapted to couple to respective end effectors, wherein each respective end effector is adapted to carry a substrate;
an upper arm drive assembly adapted to rotate the upper arm relative to the base;
a forearm drive assembly adapted to rotate the forearm relative to the upper arm, the forearm drive assembly including a forearm drive motor mounted to the upper arm, and a drive member above the divider; and
a wrist member drive assembly adapted to independently rotate the dual wrist members relative to the forearm, the wrist member drive assembly including a first wrist drive motor and a second wrist drive motor mounted to the upper arm, a first wrist drive member below the divider, and a second wrist drive member below the divider.

\* \* \* \* \*